United States Patent
Hossain et al.

[19]

[11] Patent Number: 6,075,261
[45] Date of Patent: *Jun. 13, 2000

[54] NEUTRON DETECTING SEMICONDUCTOR DEVICE

[75] Inventors: Tim Z. Hossain; Franklin D. Crawford, Jr.; Don A. Tiffin, all of Austin, Tex.

[73] Assignee: Advanced Micro Devices, Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/916,894

[22] Filed: Aug. 22, 1997

[51] Int. Cl.$^7$ .................................................... H01L 27/14

[52] U.S. Cl. ....................................... 257/252; 250/370.05

[58] Field of Search ......................... 257/252; 250/370.05

[56] References Cited

U.S. PATENT DOCUMENTS

| | | |
|---|---|---|
| 5,019,886 | 5/1991 | Sato et al. . |
| 5,321,269 | 6/1994 | Kitaguchi et al. .................. 250/370.05 |
| 5,331,164 | 7/1994 | Buehler et al. ..................... 250/370.02 |

OTHER PUBLICATIONS

Fitzsimmons et al., "Test of a Boron–Phosphide Neutron Detector", Located on the Internet at http://strider.lansce.lanl.gov/ins...r_experiments/boron_phosphide.html, pp. 1–2 (Jun. 26, 1997).

May et al., "A New Physical Mechanism for Soft Errors in Dynamic Memories", 1978 International Reliability Physics Symposium, 16th Annual Proceedings Reliability Physics 1978, San Diego, CA, Apr. 18–20, 1978, Sponsored by the IEEE Electron Devices Society and the IEEE Reliability Group, p. 33–40 (1978).

*Primary Examiner*—Olik Chaudhuri
*Assistant Examiner*—Douglas A. Wille

[57] ABSTRACT

A neutron detecting semiconductor device and process for fabricating the same is provided. In one particular embodiment, a semiconductor device for detecting neutrons is formed by forming one or more memory cells on a substrate and forming a neutron-reactant material over the one or more memory cells. Upon reacting with a neutron, the neutron-reactant material emits one or more particles capable of inducing a state change in the one or more memory cells. The neutron-reactant material may be formed from a borophosphosilicate glass (BPSG) having a relatively high concentration of $^{10}$Boron. For example, the concentration $^{10}$Boron may range from 80 to 100 percent or 95 to 100 percent of the total Boron concentration in the BPSG material.

25 Claims, 6 Drawing Sheets

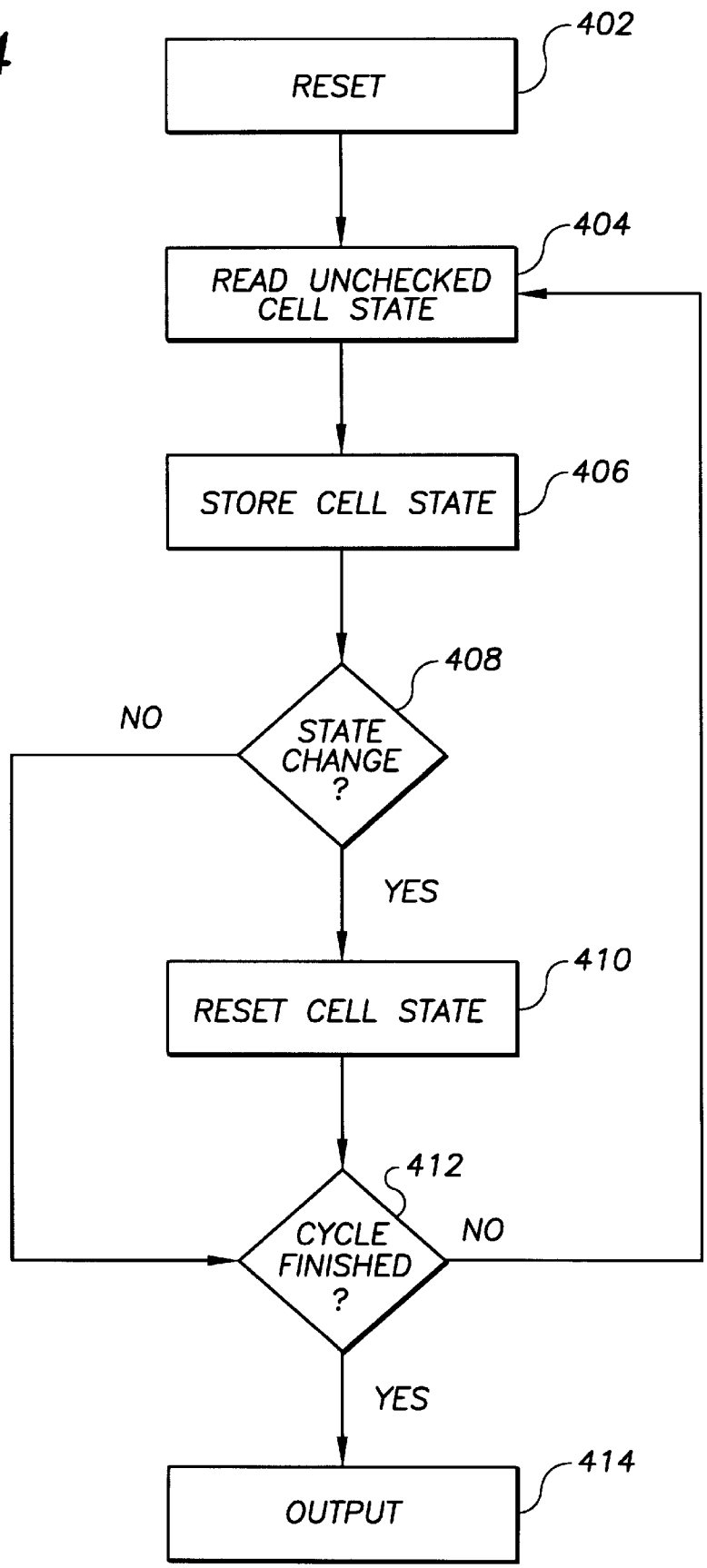

NEUTRON DETECTING SEMICONDUCTOR DEVICE

FIELD OF THE INVENTION

The present invention is directed generally to semiconductor devices, and more particularly, to a neutron detecting semiconductor device and a process for fabricating such a device.

BACKGROUND OF THE INVENTION

Conventional neutron detectors generally include a sealed vessel containing a neutron sensitive gas, such as $^3$He or $BF_3$, and an electrically charged wire having leads which extend outside of the vessel. In operation, incident neutrons react with the gas to produce charged particles which change the electrical potential of the wire. A measurement system coupled to the charged wire measures the electrical pulses and uses this information to indicate the presence of neutrons. These types of neutrons detectors are undesirably bulky and are associated with poor sensitivity resulting from, for example, electronic noise.

Attempts have been made to produce more portable neutron detectors using semiconductors. For example, in U.S. Pat. No. 5,019,886, entitled "Semiconductor-Based Radiation Detector Element", $^3$He is diffused into a semiconductor substrate and used in the detection of neutrons. This particular neutron detector is associated with a number of drawbacks, including, for example, high cost and difficult manufacturing.

SUMMARY OF THE INVENTION

Generally, the present invention relates to a neutron detecting semiconductor device and process for fabricating the same. In one particular embodiment, a semiconductor device for detecting neutrons is formed by forming one or more memory cells on a substrate and forming a neutron-reactant material over the one or more memory cells. Upon reacting with a neutron, the neutron-reactant material emits one or more particles capable of inducing a state change in the one or more memory cells. The neutron-reactant material may be formed from a borophosphosilicate glass (BPSG) having a relatively high concentration of $^{10}$Boron. For example, the concentration $^{10}$Boron may range from 80 to 100 percent or 95 to 100 percent of the total Boron concentration in the BPSG material.

A semiconductor device for detecting neutrons, in accordance with one embodiment of the invention, includes a substrate on which is disposed one or more memory cells. Disposed over the memory cells is neutron-reactant material which, upon reacting with a neutron, emits one or more particles capable of changing the state of one or more of the memory cells. The device further includes a controller coupled to the memory cells and configured to read the states of the memory cells in order to detect the presence of a neutron field.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIG. 4 illustrates an exemplary process for detecting neutrons in accordance with an embodiment of the invention.

Figure 1A:
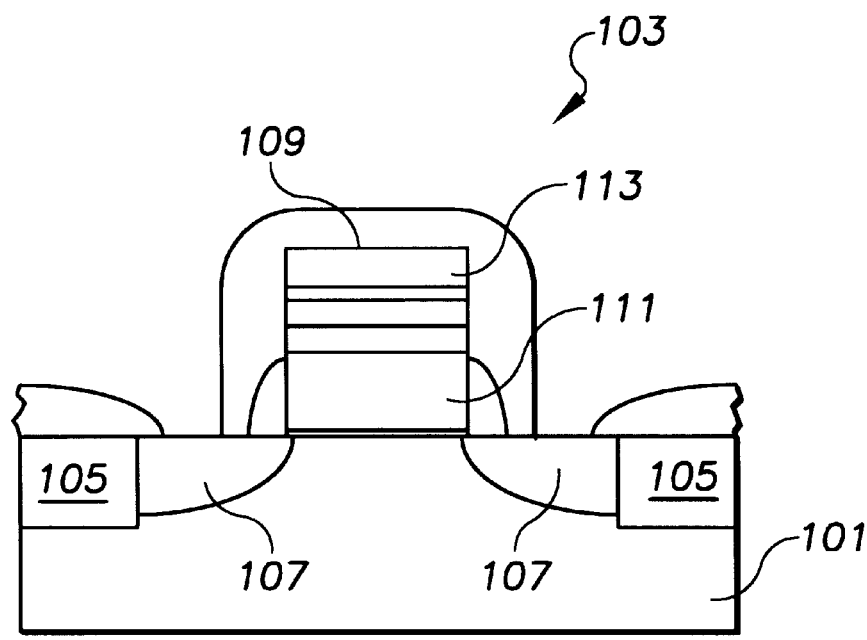
FIGS. 1A–1E illustrate an exemplary fabrication process in accordance with one embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to the detection of neutrons using a semiconductor device. The invention is particularly suited for detection of neutrons using flash memory transistors. While the present invention is not so limited, an appreciation of various aspects of the invention will be gained through a discussion of the various application examples operating in such environments.

In accordance with an embodiment of the invention, a semiconductor device for detecting neutrons is provided. The semiconductor neutron detector generally includes a memory arrangement having one or more memory cells and a controller coupled to the memory arrangement for reading the states of the memory cells and detecting the presence of a neutron field. As should be appreciated, each of the memory cells has a state indicated by the presence or the absence of an electric charge. In accordance with an aspect of the invention, a neutron-reactant material, which emits one or more particles upon reacting with a neutron, is disposed over each of the memory cells. When a neutron penetrates the neutron-reactant material, one or more particles are generated which can change the state of a memory cell. The controller is configured to detect these state changes and use this information to, for example, indicate the presence and magnitude of a neutron field.

Turning now to FIGS. 1A–1E, there is illustrated an exemplary process for forming neutron-sensitive memory cells in accordance with one embodiment of the present invention. Consistent with this embodiment, one or more memory cells (only one of which is shown) are formed on a substrate 101. The substrate 101 is typically formed from silicon, however other materials may be used. In the illustrated embodiment, the memory cell 103 is a flash memory transistor. The memory cell 103 is generally formed between isolation regions 105 and includes source/drain regions 107 and a gate structure 109. The gate structure 109 may, for example, include a floating gate 111 and a select gate 113, separated by a composite oxide/nitride/oxide layer. Formed over the gate structure 109 may, for example, be an insulating layer 119, such as an oxide. The resultant structure is illustrated in FIG. 1A. It should be appreciated that illustrated memory cell may be fabricated using a number of well-known techniques.

Figure 1B:
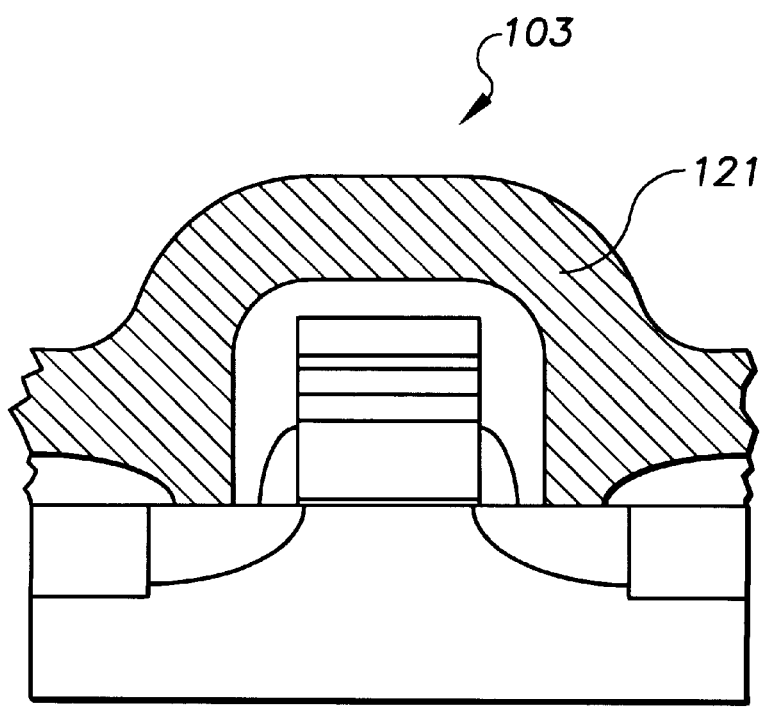

A layer 121 of neutron-reactant material is formed over the memory cell 103, as illustrated in FIG. 1B. The neutron-reactant material includes one or more elements which react with neutrons to emit one or more particles capable of changing the state of the memory cell 103. Suitable neutron-reactive elements includes $^{10}$Boron, $^{7}$Lithium, and $^{235}$Uranium, for example. As will be discussed further below, when a neutron reacts with $^{10}$Boron, for example, a $^{7}$Lithium particle and a $^{4}\alpha$ particle are emitted. Either of these particles can change the state of a memory cell.

The neutron-reactant material may, for example, be an oxide, such as $SiO_2$, doped with a relatively high concentration of $^{10}$Boron. In one particular embodiment, the neutron-reactant material is a borophosphosilicate glass (BPSG) having a relatively high concentration of $^{10}$Boron ($^{10}$BPSG). The particular concentration of $^{10}$Boron may be suitably selected in consideration of the desired sensitivity of the neutron detector as well as in consideration of device reliability. Typically, the concentration of $^{11}$Boron is relatively high as compared to the concentration of the $^{10}$Boron isotope in naturally occurring Boron. It should be appreciated that naturally occurring Boron typically includes 20% of the $^{10}$Boron isotope and 80% $^{11}$Boron isotope. Suitable concentrations of $^{10}$Boron range from about 80 to 100 percent of the total Boron concentration in the $^{10}$BPSG material. In some embodiments, concentrations of $^{10}$Boron may range from about 95 to 100 percent of the total Boron concentration.

A $^{10}$BPSG layer may be formed in a number of manners. For example, a $^{10}$BPSG layer may be formed by conventional BPSG deposition using a source of Boron having a relatively high concentration of the $^{10}$Boron isotope. In one particular embodiment, a $^{10}$BPSG layer is formed by forming a phosphosilicate glass (PSG) layer over the memory cell 103 and selectively implanting a relatively high concentration of $^{10}$Boron into the PSG layer. For example, a concentration of $^{10}$Boron ranging from about 80 to 100 percent or about 95 to 100 percent of the total Boron concentration may be implanted. One particular method for selectively implanting Boron isotopes into a PSG layer is described in commonly owned and assigned U.S. patent application Ser. No. 08/748,815, entitled "Alternative Process for BPTEOS/BPSG Layer Formation," filed Nov. 14, 1996, the contents of which are herein incorporated by reference.

Figure 1C:
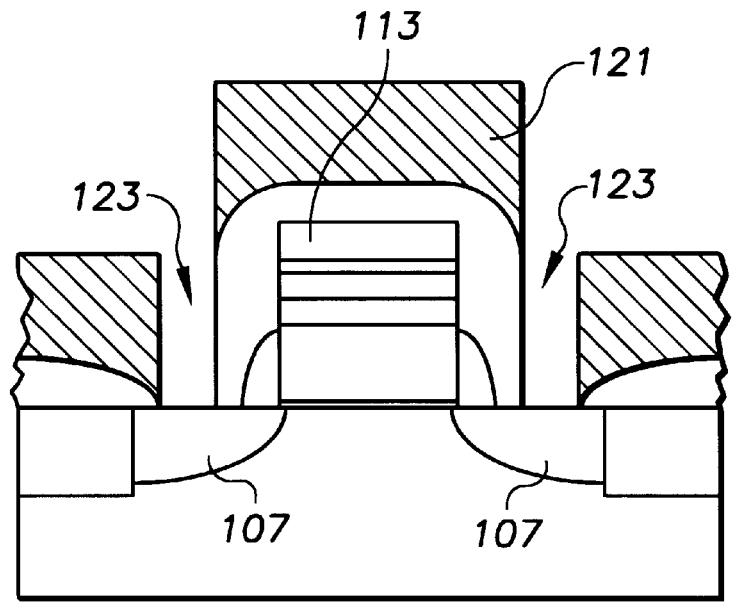

Portions of the neutron-reactant material 121 may be selectively removed to form contact openings 123 to active portions (e.g., source/drain regions 107 and select gate 113) of the memory cell 103. The resultant structure is illustrated in FIG. 1C. Formation of the contact openings 123 may be performed using, for example, well-known photolithography and etching techniques. Prior to forming the contact openings 123, the wafer may be heated to flow the neutron-reactant layer 121. The thickness of the neutron-reactant material is selected to allow penetration of some of the emitted particles, such as $^{4}\alpha$, into the underlying memory cell. Suitable thickness range from about 2000 to 5000 angstroms for many applications.

Figure 1D:
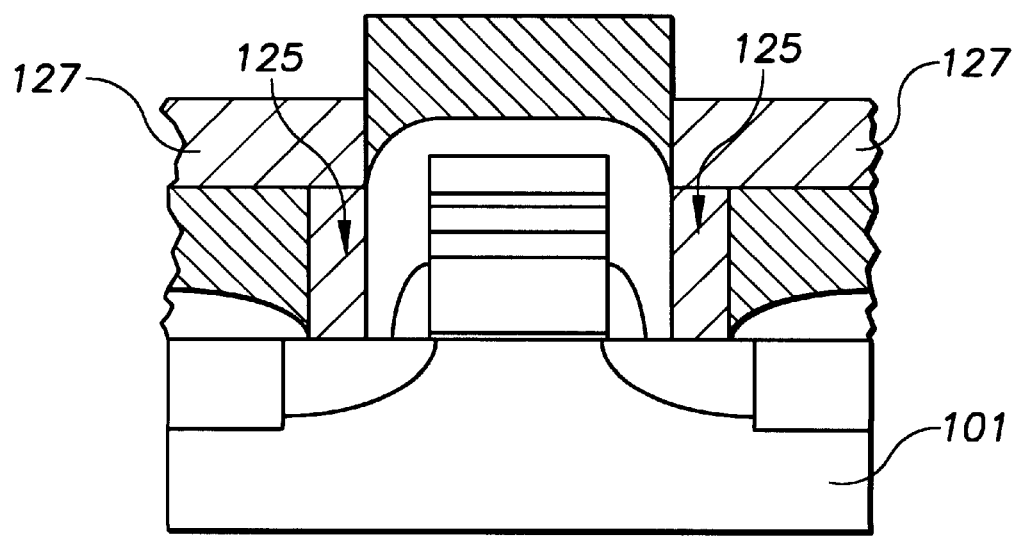

Conductive contacts 125 are formed in the contact openings 123 to electrically contact active portions of the memory cell 103. This may be accomplished by, for example, depositing a metal, such as tungsten or aluminum, and removing portions of the metal using well-known techniques. A conductive layer 127 is then formed over the substrate 101 to electrically couple the conductive contacts 125. This may be accomplished by, for example, depositing a metal and selectively removing the metal using well-known photolithography and etching techniques. The resultant structure is illustrated in FIG. 1D.

Figure 1E:
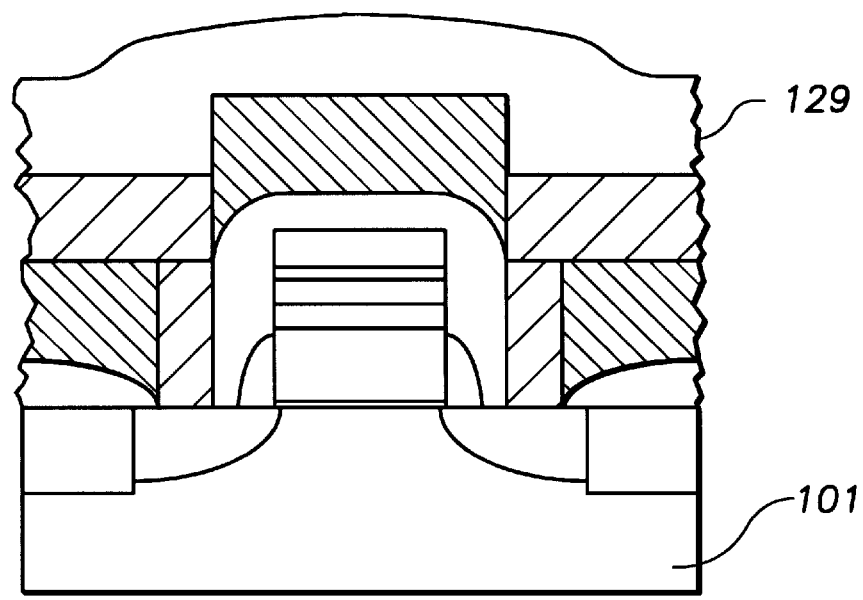

A passivation layer 129 may be formed over the substrate 101 to cover the semiconductor device. The resultant structure is depicted in FIG. 1E. The passivation layer 129 is typically an oxide, such as silicon dioxide. Suitable thicknesses for the passivation layer 129 range from about 500 to 5000 angstroms and up for many applications.

Using the above described process, a neutron reactant material may be formed over one or more memory cells. As will be discussed further below, the neutron-reactant material, when penetrated by a neutron, emits particle(s) which can change the state of a memory cell. While the above described process generally illustrates the formation of a neutron-reactant material over a flash memory transistor, it should be appreciated that the present invention is not so limited. For example, other types of memory cells such as dynamic random access memory (DRAM) cells, static random access memory (SRAM) cells, or charge coupled devices (CCD) may be used with the present invention. Moreover, the particular type of flash memory transistors which may be used for the present invention are not limited to the particular flash memory structure illustrated in the above process.

Figure 2A:
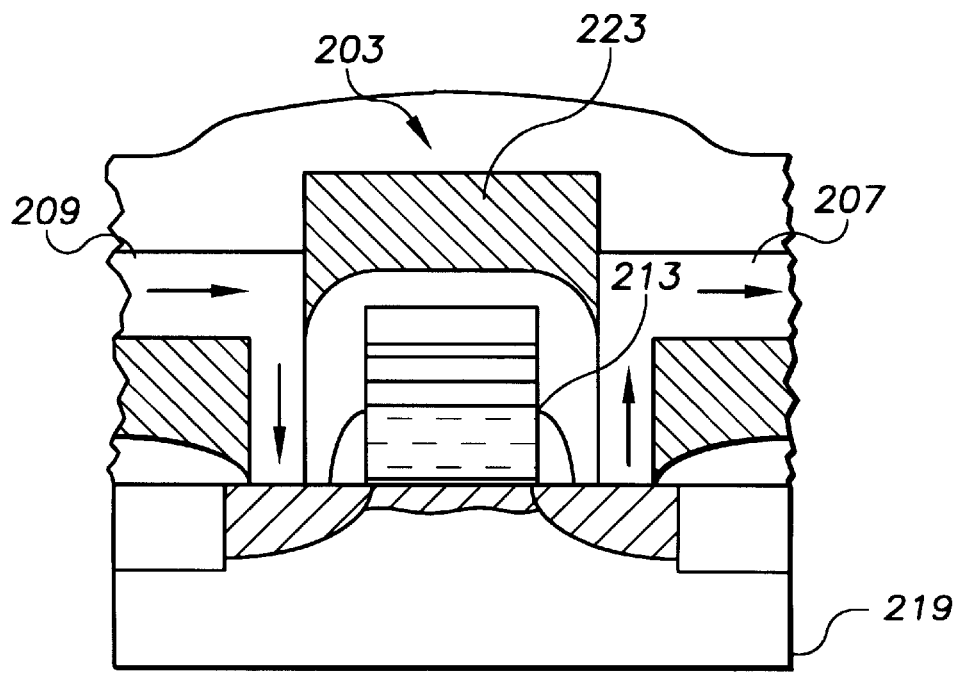
FIG. 2A–2C illustrate a state change of a memory cell in accordance with one embodiment of the invention.
Figure 2B:
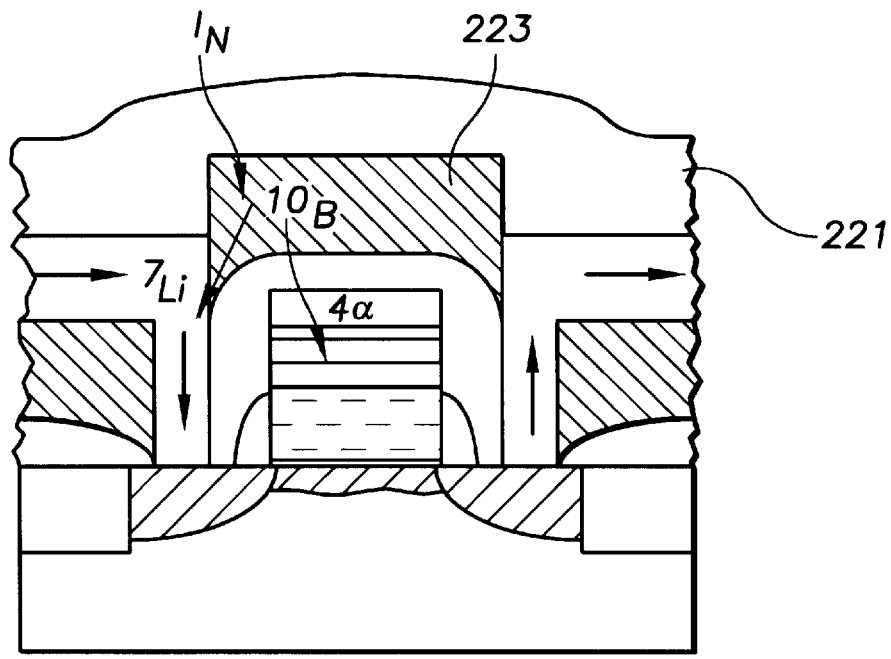
Figure 2C:
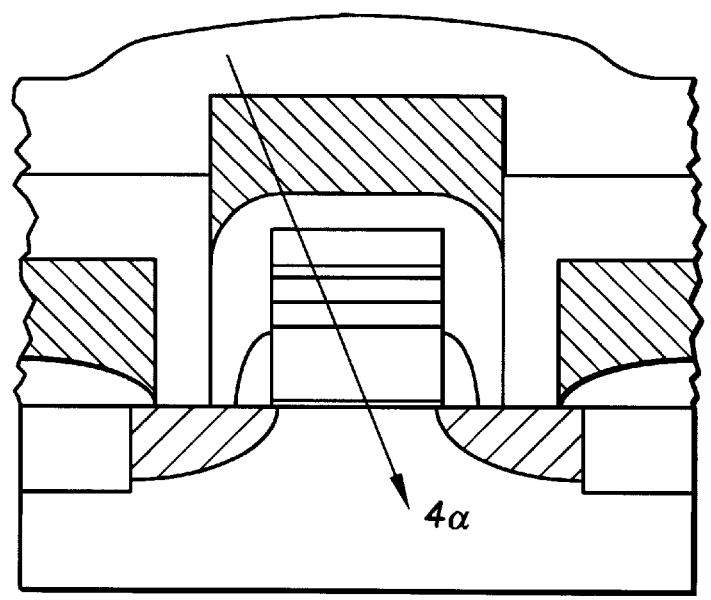

As noted above, the structure illustrated in FIG. 1E can be used for the detection of neutrons. Generally, in accordance with the present invention, neutrons are detected by determining whether or not the state of a given memory cell has changed. FIGS. 2A–2C diagramatically illustrate how the state of a memory cell may change in the presence of a neutron field. In FIG. 2A, there is illustrated a flash memory transistor 203 having thereover a neutron-reactant material 223, such as BPSG with a relatively high concentration of $^{10}$Boron. The state of the flash memory transistor 203 illustrated in FIG. 2A is an on-state or a logical 1 state. Generally the logical 1 state is associated with a negative charge on the floating gate 213 and an inversion layer 214 beneath the floating gate 213.

FIG. 2B generally illustrates the reaction occurring when a neutron penetrates the passivation layer 221 and reacts with a $^{10}$Boron atom in the neutron-reactant material 223. The reaction of the neutron with the $^{10}$Boron atom generally produces a $^{7}$Lithium particle and a $^{4}\alpha$ particle in accordance with the following relationship:

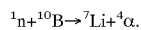

$$^{1}n + ^{10}B \rightarrow ^{7}Li + ^{4}\alpha.$$

As the alpha particle ($^{4}\alpha$) passes through the inversion layer 214, electron holes are produced and the charge in the channel region is sufficiently reduced to remove the inversion layer 214 and change the state of the device as illustrated in FIG. 2C.

Figure 3:
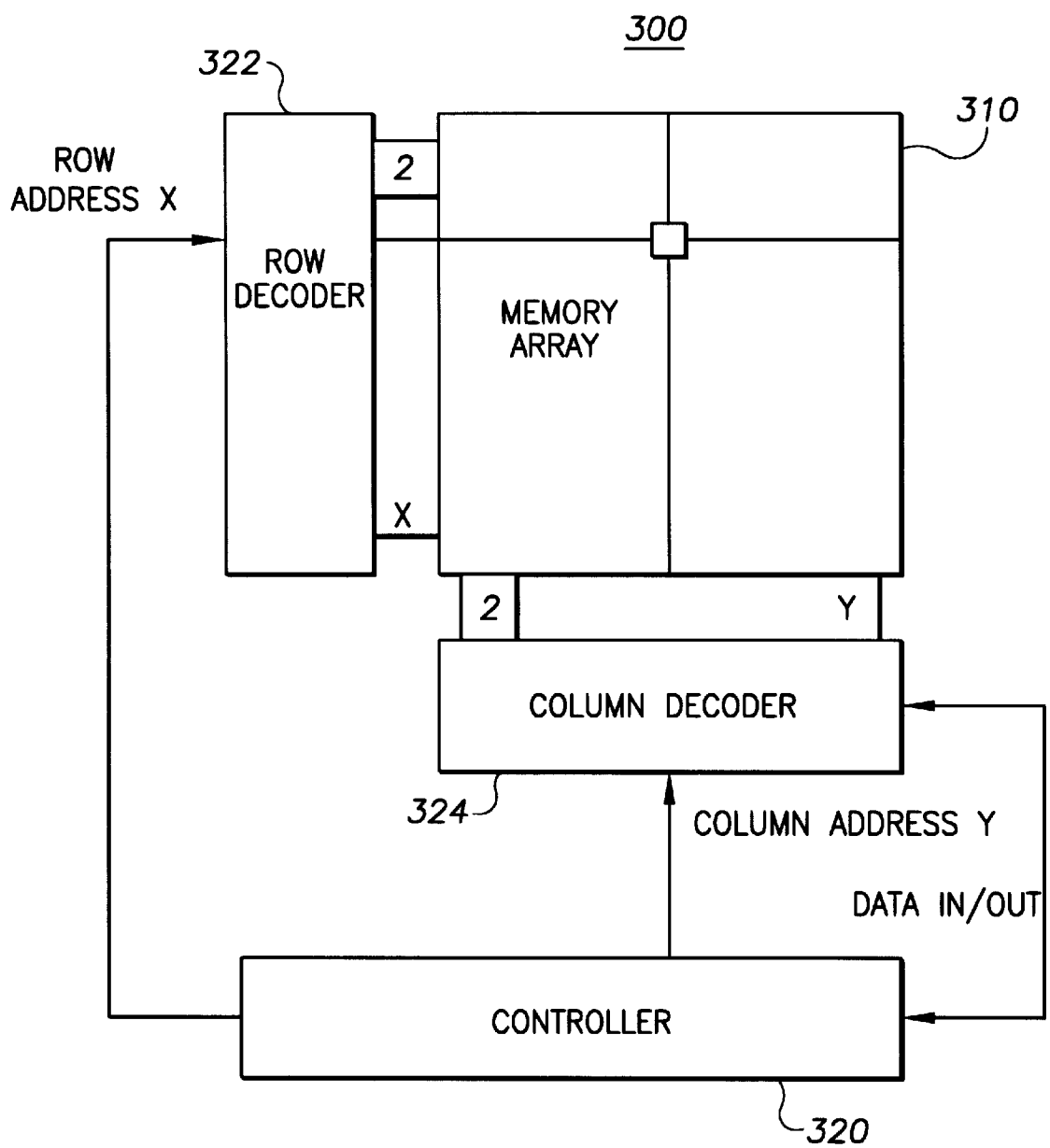
FIG. 3 illustrates an exemplary neutron detector in accordance with one embodiment of the invention.

Turning now to FIG. 3 there is illustrated a neutron detecting semiconductor device in accordance with one embodiment of the invention. The semiconductor neutron detector 300 generally includes a memory arrangement 310 coupled to a controller 320. The memory arrangement 310 typically includes a plurality of memory cells each of which stores a state, such as a logical 1 or 0. A neutron-reactant material is disposed over each of the memory cells. The neutron-reactant material, upon reacting with a neutron, emits one or more particles capable of changing the state of a memory cell. The memory arrangement 310 may, for example, be a flash memory having a number of flash memory transistors. While the invention is not so limited, suitable memory arrangements include 1 megabit and 4 megabit memory arrays. The flash memory transistors may, for example, be formed in a similar manner as discussed above with respect to FIGS. 1A–1E.

The controller 320 is generally coupled to the memory arrangement 310 using a row decoder 322 and a column decoder 324. By providing a row address and a column address to the row decoder 322 and the column decoder 324, respectively, the controller 320 is able to read and write the state of each memory cell in the memory arrangement 310. The particular manner by which the controller 320 accesses each memory cell to read and write data thereto is well-known in the art.

Advantageously, the controller 310 may be formed on the same semiconductor substrate as the memory arrangement 320. This allows for an extremely portable and compact neutron detector. Semiconductor neutron detectors having dimensions of about ¾"×¾"×¼' may, for example, be manufactured. The devices may, for example, be worn on the wrist of a user, similar to a watch. However, the invention is not so limited. For example, the controller 320 may be formed on a separate semiconductor substrate than the memory arrangement 310.

In general, the controller 320 sets the state of each memory cell in the memory arrangement 310 and periodically reads the state of each memory cell to determine whether the state of the memory cell has changed. Using this information, the controller 320 can determine the presence and strength of a neutron field. Details of an exemplary process performed by a controller to detect the presence of neutrons is illustrated in the flowchart of FIG. 4.

Block 402 represents the controller resetting each memory cell of a memory arrangement to an undisturbed or an initial state. This step is typically performed when the semiconductor neutron detector is initially turned on or reset by a user. The initial undisturbed state of a memory cell is typically selected such that the state of the memory cell changes when an a particle passes through the cell. For example, as discussed above with respect to FIGS. 2A–2C, a memory cell may change states from a logical 1 to a logical 0 under such circumstances. Accordingly, the initial undisturbed state of each memory cell would be set to a logical 1.

Generally, the controller cycles through the memory arrangement, reading each memory cell to determine whether its state has changed. Block 404 represents the controller reading the state of an unchecked memory cell. This typically includes addressing the particular memory cell using a row decoder and a column decoder and reading the logic state of the cell. The state of the memory cell is then stored in memory as indicated at block 406.

Decision block 408 represents the controller determining whether the state of the checked memory cell has changed. If so, the controller resets the state of the memory cell to an undisturbed state, as indicated at block 410. Resetting the memory cell to an undisturbed state prepares the memory cell for the next detection cycle. In alternative embodiments, each cell may be reset after being read. After resetting a disturbed memory cell state or if the state of the memory cell has not changed, control moves to decision block 412 where the controller determines whether the cycle has been completed. If not, control moves back to 404 where the state of another unchecked memory cell is read.

The cycling time may vary depending on the particular type of memory arrangement used as well as the environment in which the semiconductor neutron detector is applied. Typically, the cycling time is relatively short to reduce the chance of a non-neutron induced state change of a memory cell. Suitable cycling time for many applications range from about 50 to 200 nanoseconds. In one particular application, the cycling time is about 70 nanoseconds.

After a cycle has been completed, control moves to block 414 where a detection output signal is produced. Generally this involves the controller retrieving the stored cell states of the memory cells and determining the number of cells which have changed states. The relative number of cells which have changed state (disturbed cells) compared to the number of cells in an undisturbed state may be used to determine the presence and strength of a neutron field. In general, some portion of the memory cells in a memory arrangement will undergo a state change regardless of neutron presence. This background level of state changes can, for example, range from about 0.001% to 0.1% of the memory cells in a memory arrangement. In accordance with one embodiment of the invention, the percentage of disturbed cells (disturbed percentage) is determined and compared against the background level to determine the presence of a neutron field. The disturbed percentage may also be compared to the background level to determine the strength of a neutron field. For example, the difference between the disturbed percentage and the background level may be used to determine the neutron field strength. The net change is proportional to the neutron field. In this manner, neutron fields having magnitudes as low as 0.001 neutrons/cm$^2$/sec can be sensed, for example.

The above described semiconductor neutron detector has a much greater sensitivity to neutron fields than conventional neutron detectors. For example, sensitivity of the above described semiconductor neutron detector can be 10 to 100 times more sensitive then conventional neutron detectors. Moreover, the above described neutron detector is highly portable and extremely easy to manufacture.

As noted above, the present invention is applicable to a number of semiconductor devices for detecting neutrons. Accordingly, the present invention should not be considered limited to the particular examples described above, but rather should be understood to cover all aspects of the invention as fairly set out in the attached claims. Various modifications, equivalent processes, as well as numerous communication devices to which the present invention may be applicable will be readily apparent to those of skill in the art upon review of the present specification. The claims are intended to cover such modifications and devices.

We claim:

1. A semiconductor device for detecting the strength of a neutron field, comprising:
   a substrate;
   a plurality of flash memory cells disposed on the substrate, each of the memory cells having a state;
   a neutron-reactant material disposed near the memory cells and, upon reacting with a neutron, adapted to emit one or more particles capable of changing the state of at least one of the memory cells; and
   a controller, coupled to the memory cells, adapted to set the state of each memory cell to an initial state, read the state of each of the memory cells, determine the number of memory cells changing from the initial state to a disturbed state, and use the number of memory cells having a disturbed state to determine the strength of the neutron field.

2. The semiconductor device of claim 1, wherein the neutron-reactant material includes a relatively high concentration of $^{10}$Boron.

3. The semiconductor device of claim 2, wherein the neutron-reactant material is a borophosphosilicate glass (BPSG).

4. The semiconductor device of claim 2, wherein the concentration of $^{10}$Boron ranges from about 80 to 100% of a total concentration of Boron.

5. The semiconductor device of claim 2, wherein the concentration of $^{10}$Boron ranges from about 95 to 100% of a total concentration of Boron.

6. The semiconductor device of claim 1, wherein using the number of memory cells having a disturbed state to determine the strength of the neutron field includes determining a percentage of the memory cells having the disturbed state.

7. The semiconductor device of claim 6, wherein using the number of memory cells having the disturbed state to determine the strength of the neutron field includes comparing the disturbed percentage to a background level.

8. A method of detecting the strength of a neutron field, the method comprising:

providing a plurality of flash memory cells on a substrate, each memory cell capable of storing a state;

providing a neutron-reactant material near the memory cells, wherein, upon reacting with a neutron, the neutron-reactant material emits one or more particles capable of changing the state of at least one of the memory cells;

setting the state of each memory cell to an initial value;

reading the state of each of the memory cells to determine the number of memory cells changing from the initial state to a disturbed state; and using the number of memory cells having a disturbed state and determining the strength of the neutron field.

9. The method of claim 8, wherein using the number of memory cells includes determining a percentage of the memory cells having the disturbed state.

10. The method of claim 9, wherein using the number of memory cells further includes comparing the disturbed percentage to a background level.

11. The method of claim 8, wherein the neutron-reactant material includes a BPSG with a relatively high concentration of $^{10}$Boron.

12. The method of claim 11, wherein the concentration of the $^{10}$Boron in the BPSG ranges from about 80 to 100% of a total Boron concentration.

13. The method of claim 11, wherein the concentration of $^{10}$Boron in the BPSG ranges from about 95 to 100% of a total Boron concentration.

14. The device of claim 1, wherein each flash memory cell includes a floating gate disposed over a channel region and the controller sets the first state of a particular flash memory cell by creating an inversion layer in the channel region of the particular flash memory cell, wherein an emitted particle changes the state of the particular flash memory cell by removing the inversion layer.

15. The method of claim 8, wherein each memory cell is a flash memory cell which includes a floating gate disposed over a channel region and wherein setting the state of each memory cell includes creating an inversion layer in the channel region of each memory cell, wherein an emitted particle changes the state of a particular flash memory cell by removing the inversion layer.

16. A semiconductor device for detecting the presence of a neutron field, comprising:

a substrate;

a plurality of flash memory transistors disposed on the substrate, each of the transistors having a floating gate disposed over a channel region, each transistor having a first state associated with an inversion layer in the respective channel region and a second state associated with the absence of the inversion layer;

a borophosphosilicate glass having a relatively high concentration of $^{10}$B disposed near each transistor, the borophosphosilicate glass emitting an alpha particle upon reacting with a neutron, wherein an emitted alpha particle is capable of removing an inversion layer and changing the state of a transistor; and a controller, coupled to the transistors, for setting a memory state of each transistor to the first state, reading the memory state of each transistor to determine the number of transistors changing from the first state to the second state, and using the number of transistors having the second state to determine the presence of the neutron field.

17. The semiconductor device of claim 16, wherein using the number of transistors having the second state to determine the presence of the neutron field includes determining a percentage of the transistors having the second state.

18. The semiconductor device of claim 17, wherein using the number of transistors having the second state to determine the presence of the neutron field includes comparing the percentage to a background level.

19. The semiconductor device of claim 16, further including using the number of transistors having the second state to determine the strength of the neutron field.

20. The semiconductor device of claim 19, using the number of transistors having the second state to determine the strength of the neutron field includes determining a percentage of the transistors having the second state and comparing the percentage to a background level.

21. The semiconductor device of claim 16, wherein the borophosphosilicate glass (BPSG) has a thickness ranging from 2000 to 5000 angstroms.

22. The semiconductor device of claim 21, wherein the concentration of $^{10}$Boron in the BPSG ranges from 80% to 100% of a total concentration of Boron in the BPSG.

23. The semiconductor device of claim 21, further including an insulating layer disposed over the floating gate of each transistor and separating the BPSG from the floating gates.

24. The semiconductor device of claim 23, wherein the insulating layer encapsulates each of the floating gates.

25. The semiconductor device of claim 16, wherein each transistor includes source and drain regions disposed in the substrate, the source and drain regions of each transistor covering similar areas.

* * * * *